US005499450A

United States Patent [19]
Jacoby

[11] Patent Number: 5,499,450
[45] Date of Patent: Mar. 19, 1996

[54] METHOD OF MANUFACTURING A MULTIPLE PIN HEATSINK DEVICE

[76] Inventor: John Jacoby, Jackson Pond Rd., New Hampton, N.H. 03256

[21] Appl. No.: 358,956

[22] Filed: Dec. 19, 1994

[51] Int. Cl.$^6$ ................................................ B23P 15/00
[52] U.S. Cl. ............................. 29/890.03; 165/185
[58] Field of Search ................. 29/890.03, 432, 29/727; 165/185

[56] References Cited

U.S. PATENT DOCUMENTS

| | | | |
|---|---|---|---|
| 3,327,779 | 6/1967 | Jacoby | 165/185 |
| 4,709,374 | 12/1988 | Jacoby | 165/185 |
| 4,733,453 | 3/1988 | Jacoby | 29/432 |
| 5,224,538 | 7/1993 | Jacoby | 165/166 |
| 5,406,698 | 4/1995 | Lipinski | 29/890.03 |

*Primary Examiner*—Irene Cuda
*Attorney, Agent, or Firm*—Barlow & Barlow, Ltd.

[57] ABSTRACT

A multiple pin heatsink device with U-shaped wire elements mechanically swaged into channels of a base element is provided. In the manufacture of the multiple pin heatsink, pins of the U-shaped wire element are introduced into respective pin receiving holes present in the upper surface of a die member to expose the central portion of each wire element. A base element with channels that match the arrangement of the wire elements in the die member is applied with pressure to the exposed central portions of the wire elements to effectively swage and expand the central portions of the wire elements into the corresponding matching channels in the base member for permanent attachment of the wire elements to the base element. In addition, protrusions are provided on either side of the exposed central portion of the wire elements on the die to create indents in the base element to form retaining lips partially over the central portion of the wire elements to further prevent removal of the wire elements from the base element. The base element and wire elements connected thereto are removed from the die member to reveal the completed multiple pin heatsink device.

8 Claims, 4 Drawing Sheets

U.S. Patent    Mar. 19, 1996    Sheet 1 of 4    5,499,450
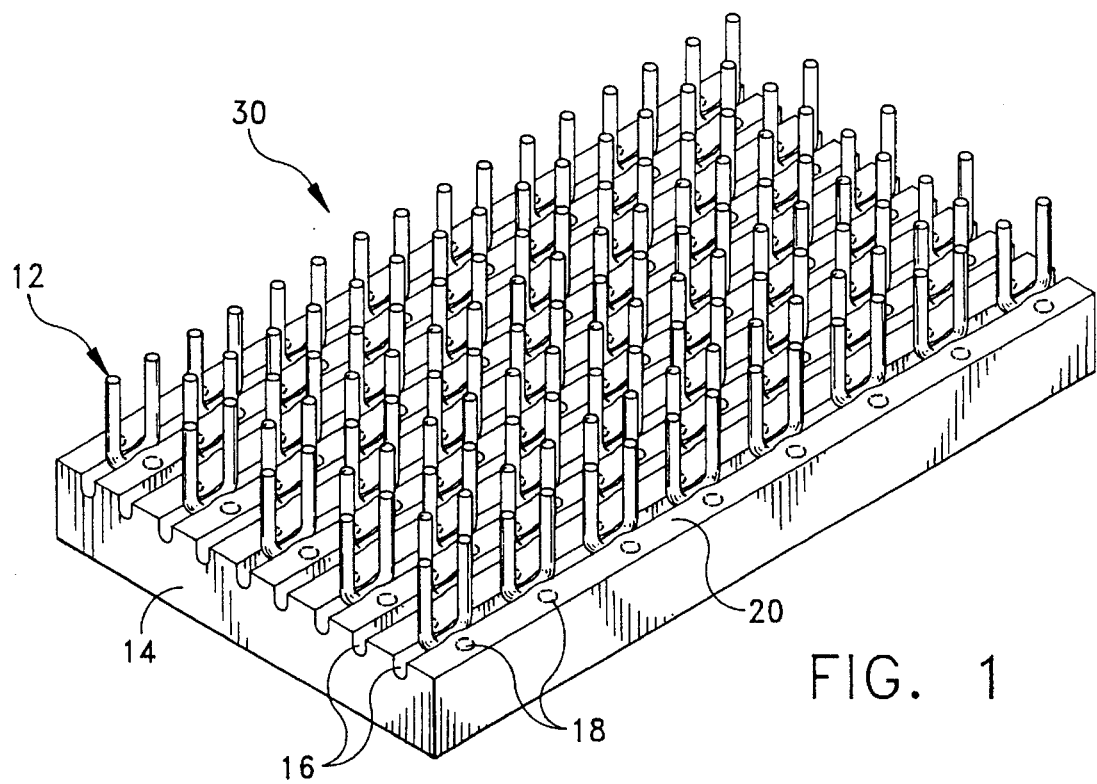
FIG. 1
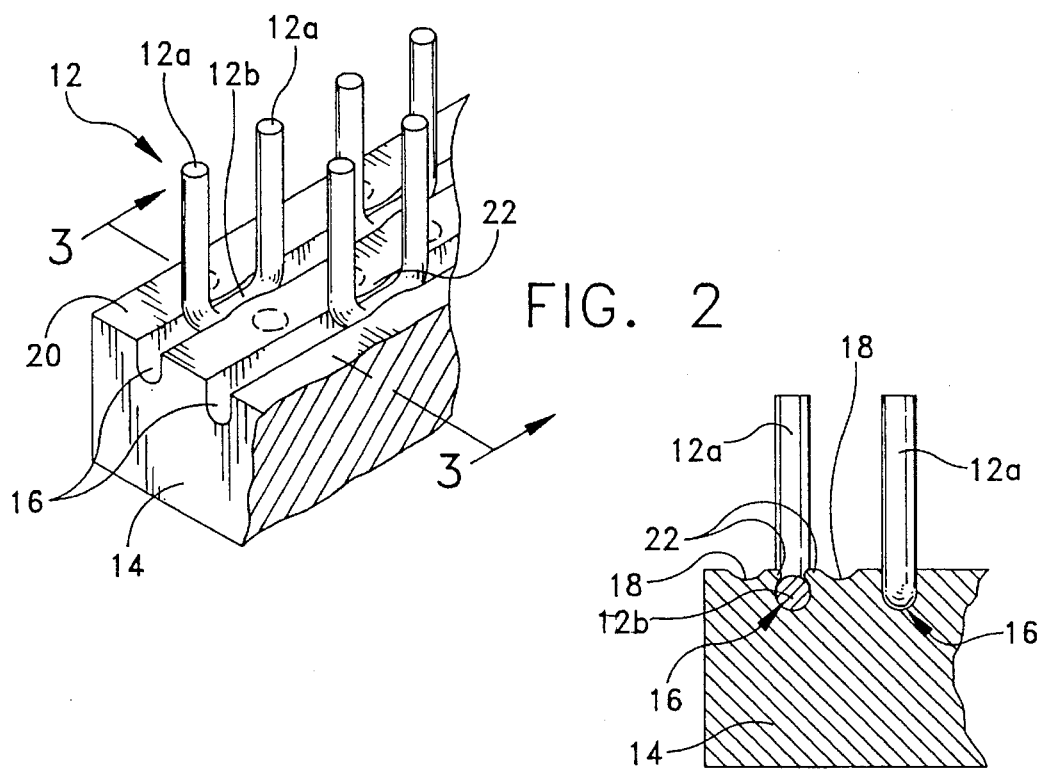
FIG. 2
FIG. 3

METHOD OF MANUFACTURING A MULTIPLE PIN HEATSINK DEVICE

BACKGROUND OF THE INVENTION

The present invention relates generally to a multiple pin heatsink device and method. In the electronics industry, it has been well known to employ multiple pin heatsinks to dissipate the heat generated by electronic components on a printed circuit board. These known heatsinks typically include a base plate which is directly mounted to the circuit board with a number of pins attached thereto extending from the upper surface for maximum exposure to the surrounding air. For effective heat dissipation, the base plate and the pins are composed of a heat-dissipating metal alloy.

In general, these pin fin surfaces suffer from high production costs as compared to other devices in the competitive heat transfer field. While the pin fin-type heatsinks have high performance capabilities, their actual commercial uses have been restricted due to the high production costs. Such high costs to manufacturers of such pin fin heatsinks result from high material outlay to cut the pin patterns from solid or extruded shapes as well as the fixturing and brazing costs associated with attaching the pins to the base plate surfaces.

It has been known in the prior art to employ U-shaped pin pairs of wire elements for constructing a heatsink device. Such U-shaped wire elements have advantages over individual pins in the assembly of heatsinks in that the connecting central portion of the U-shaped wire element provides a wide surface area for securing the wire element to the base plate which includes an increased surface area for maximum heat dissipation. However, these U-shaped wire elements must be affixed to a base plate surface by a laborious and costly metallurgical process such as brazing, welding, or soldering. For example, the U-shaped wire elements are introduced into a die made of paper for maintaining the wire elements in the desired array with central portions, which connect the two pins together, exposed above the die. Solder paste is then applied to the central portions and then a substrate is placed in contact with the central portions with solder paste thereon. The entire fixture is heated in an oven to cure the solder paste and burn off the paper die to leave a base element with upstanding pins connected thereto. This is a time consuming, tedious and relatively expensive procedure. Solder paste or brazing compound must be purchased and properly applied; the pins must be held in place and heat must be properly applied. Similarly, welding techniques are likewise expensive, time consuming and complex and often provide less than optimum results.

As an alternative to employing U-shaped wire elements, the pin fin arrangement may be cast. However, casting methods require expensive molds and heat sources. Further, the metal alloys employed in the casting of multiple pin heatsinks are typically limited to materials which are relatively poor conductors of heat. Also, the casting process itself reduces the heat dissipation of the metal alloys because porosity and granular structure are typically formed in the cast pins. Moreover, due to the surface tension of the molten pin material, it is extremely difficult to draw that material into the extremely narrow pin molds even using a vacuum pump.

In view of the foregoing, a multiple pin heatsink device, which can be easily manufactured at low cost without brazing, soldering or welding is desired. In particular, there is a need for a multiple pin heatsink device which can be formed and assembled mechanically while still employing the preferable U-shaped wire elements for forming the pins of the heatsink device.

SUMMARY OF THE INVENTION

The present invention preserves the advantages of prior art multiple pin heatsink devices. In addition, it provides new advantages not found and currently available heatsink devices, and overcomes many of the disadvantages of such currently available devices.

The invention is generally directed to a novel and unique multiple heat pin sink device and method of manufacturing the same which has particular application in assembling heatsinks which employ U-shaped wire elements. The multiple pin heatsink device and method of the present invention enables a low cost, simple and non-metallurgical assembly of a multiple pin heatsink device.

The preferred embodiment of the present invention includes a base element having an upper surface as well as a number of channels in its upper surface. A number of U-shaped wire elements are provided with each including two pins connected by a central wire portion. The U-shaped wire elements are connected to the base element with the central wire portion of the U-shaped wire elements residing within the channels of the base element. With the central wire portions installed in the channels, the pins connected thereto are positioned substantially perpendicular to the upper surface of the base element. In addition, a pair of retaining lips, which correspond to each U-shaped wire element, are positioned on the upper surface of the base element and straddle the channel in which the U-shaped wire element resides. The retaining lips extend inwardly into the channel and are positioned partially over the central wire portion of each U-shaped wire element to prevent removal of the wire elements from its channel.

During the manufacture of the multiple pin heatsink of the present invention, a die member is provided with a number of pairs of pin receiving holes in its upper surface to form a desired array. A base element is provided with a number of channels in its upper surface which align and correspond with rows of the pin receiving holes. U-shaped wire elements, each with two substantially parallel pins and a central portion, are introduced into respective pairs of pin receiving holes in the die member with the central portion remaining on the upper surface of the die member. The base element is placed over the die member with the channels of the base element aligning with the exposed central portions of the U-shaped wire elements. Sufficient downward pressure is then applied to the base element to swage and expand the central portions of the wire elements into the matching channels in the base member for permanent attachment of the wire elements to the base element. The base elements and wire elements attached thereto are removed to free the completed multiple pin heatsink from the die.

In addition, protrusions are provided on the upper surface on the die member in a location which is proximal to the central portions of the U-shaped wire elements. When downward pressure is applied to the base element, the protrusions on the upper surface of the die member are driven into the base element near the central portions now residing in their corresponding channels. Due to the contact of the protrusions into the base element, portions of the base element are urged inwardly into the respective channel and partially over the central portions of the wire elements respectively residing therein to effectively secure the wire elements to the base element as a further means of attachment in addition to swaging the central portions of the wire elements into their respective matching channels.

It is therefore an object of the present invention to provide a multiple pin heatsink device with a high performance pin fin surface.

Another object of the present invention is to provide a multiple pin heatsink device with low production costs.

It is a further object of the invention to provide a multiple pin heatsink device which may employ varied materials, such as a base element of aluminum and pins of copper.

It is yet a further object of the present invention to provide a method of manufacture of a multiple pin heatsink device which is completely mechanical without the need for welding, brazing, or soldering.

Another object of the present invention is to provide a method of manufacture of a multiple pin heatsink device which provides permanent affixation of the wire element pins to the base element.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

FIG. 1 is a perspective view of the preferred embodiment of a completed multiple pin heatsink device of the present invention;

FIG. 2 is a perspective view of a close-up of a portion of the heatsink device of FIG. 1 showing U-shaped wire elements residing within the base element channels;

FIG. 3 is a cross-sectional view through the line 3—3 of FIG. 2;

DETAILED DESCRIPTION OF THE PREFERRED EMBODIMENT

Figure 4:
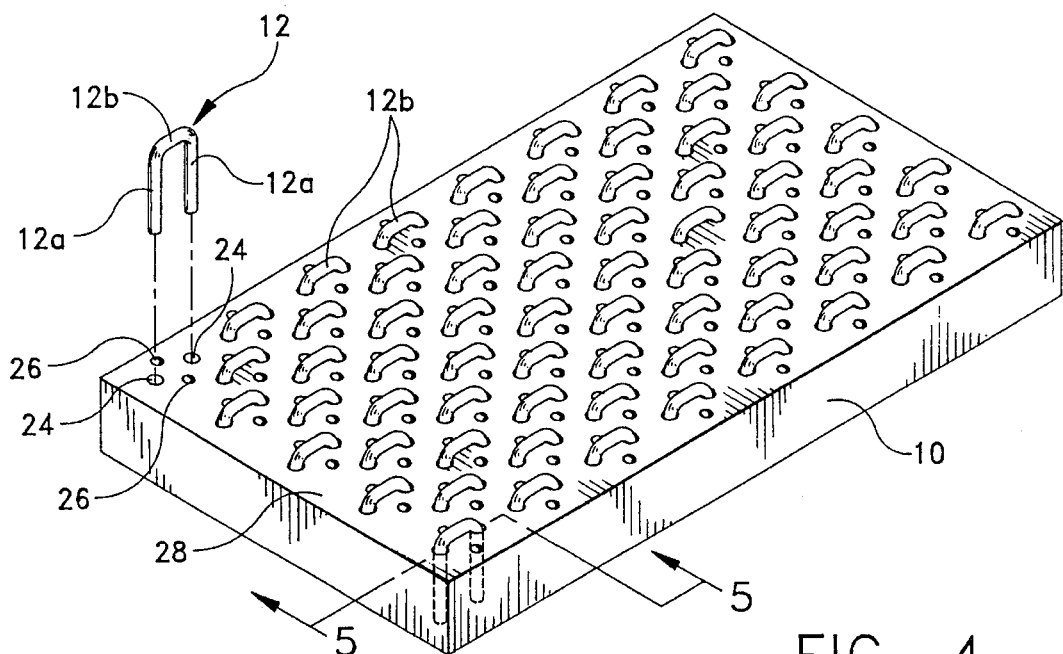
FIG. 4 is a perspective view of a die element and U-shaped wire elements residing therein which is employed in the method of manufacture of a multiple pin heatsink device of the present invention.

Referring to FIG. 1, a perspective view of a multiple pin heatsink device 30 is shown. The completed heatsink device 30 includes a base element 14 with a number of channels 16 therein for receiving a number of heat dissipating U-shaped wire elements or pins 12. As can be seen in FIG. 1, and in greater detail in FIG. 2, base element 14 includes a number of channels 16 formed in its upper surface 20. It is preferred that channels 16 be formed parallel and equidistant to one another and extending along the entire length of base element 14 for ease of manufacturing. For example, base element 14 may be prepared for receiving wire elements 12 by extruding or cutting grooves to form the desired pin row locations. It should be understood, however, that other grooved locations and configurations may be employed to accommodate the desired pin pattern on base element 14.

Still referring to FIG. 2, each wire element 12 includes a pair of pins 12a and a central portion 12b to form a general U-shaped wire element as generally referred to as 12. Wire elements 12 reside in channels 16 by the central portion 12b of each wire element 12 being seated directly within channel 16. It is preferred that channels 16 have a floor which mates closely with central portion 12b. The cross-sectional view through line 3—3 of FIG. 2 can be seen in FIG. 3 to illustrate the seating of the wire elements within channels 16. As will be discussed in detail below, in conjunction with the method of manufacture, the central portions 12b of wire elements 12 are swaged into channels 16 by a mechanical operation to secure the wire elements 12 to the base element 14. The employment of U-shaped wire elements 12, as can be seen in FIG. 1–3, overcomes the disadvantages found in the prior art by allowing a machine-fixtured or preformed wire pin configurations to be incorporated with the central portions 12b directly fixed to the base element in a single mechanical operation. In contrast to the mechanical swaging of individual pins to a base element, the employment of U-shaped elements is vastly superior and results in high conductivity from its pins 12a to the base because central portions 12b of U-shaped wire elements 12 have a large contact area for communicating with the base element 14. With this direct metal-to-metal contact with large cross-sectional contact area, a very low thermal resistance can be realized. As a result, superior heat dissipation from base element 14 to wire elements 12 can be achieved.

As stated above, wire elements 12 are swaged into channels 16 to form a tight press-fit. To achieve such a press-fit, a groove of 0.061 in. may be formed in base element 14 to receive, under pressure, U-shaped wire elements 12 having a diameter of 0.063 in. When wire elements 12 are swaged into channel 16, as will be discussed in conjunction with the method of the present invention, a press-fit is achieved.

To further secure wire elements 12 to base element 14 a pair of retaining lips 22, as seen in FIGS. 2 and 3 may be employed to further prevent removal of wire element 12 from base element 14. The ability to completely prevent wire elements 12 from being removed from base element 14 is of prime importance in that the breaking off or removal of wire elements 12 will reduce the ability of the multiple pin heatsink device to dissipate heat to its full capacity. The mechanical attachment of wire elements 12 is vastly superior to the metallurgical bonding-type affixation of U-shaped wire elements as known in the prior art. A mechanical connection of a U-shaped wire element 12, as in the present invention, is less susceptible to deterioration or breakage as are soldering and brazing techniques. The retaining lips 22, for each wire element 12, provides a further mechanical connection of superior integrity not found in the prior art for affixation of U-shaped wire elements.

Turning now to FIG. 4, the steps of manufacture, in accordance with the method of the present invention, is shown. A die member 10 is shown to include an array of pairs of pin receiving apertures 24 in its upper surface 28. U-shaped wire elements 12 are inserted into pin receiving apertures 24 to form an array as desired. The arrangement, configuration and spacing of pin receiving apertures may be adapted to the desired final configuration of the wire elements 12, as shown in FIG. 1.

Figure 5:
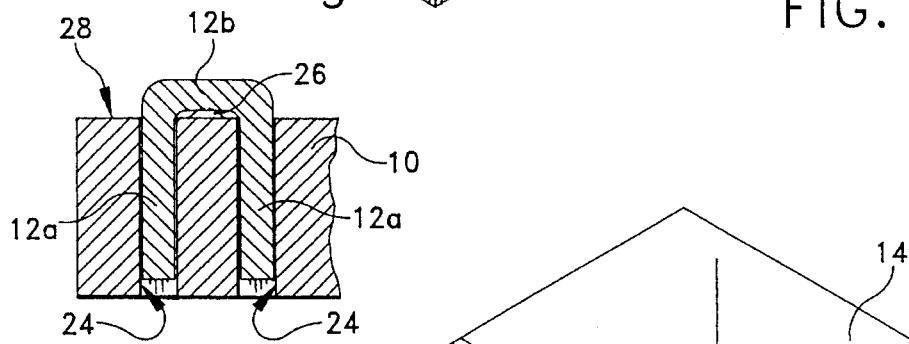
FIG. 5 is a cross-sectional view through line 5—5 of FIG. 4.
Figure 6:
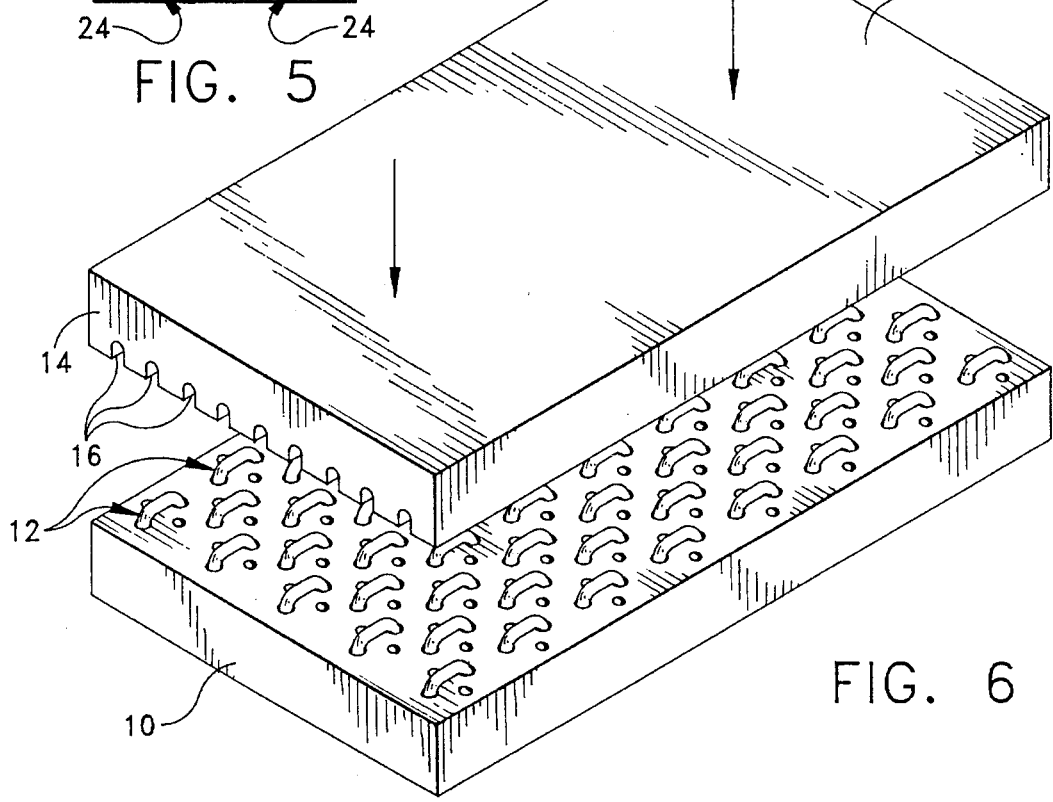
FIG. 6 is a perspective view of a step of driving the base element to the die element in accordance with the method of manufacture of a heatsink device of the present invention.

In the manufacture of the multiple pin heatsink device 30 of the present invention, wire elements 12 are installed into pin receiving apertures 24 with pins 12a residing in apertures 24 and central portions 12b of each wire element 12 remaining above the upper surface 28 of die 10. FIG. 5, a cross-sectional view through line 5—5 of FIG. 4, shows in detail the installation of a wire element 12 within a pair of pin receiving apertures 24. As can be seen in FIG. 5, central portion 12b is slightly raised above the surface of upper surface 28 of die 10. This is due to the slight curvature of the junctions between pins 12a and central portion 12b. In the event that central portion 12b has a perfect 90° joint relative to pins 12a, central portion 12b will rest flat on upper surface 28. Referring back to FIG. 4, a pair of protrusions 26 are provided on upper surface 28 on either side of the installed wire elements 12 to effectively straddle central portion 12b. The purpose of protrusions 26 will be discussed in more detail below in connection with FIGS. 8 and 9. It is preferred that wire elements 12 be installed into pin receiving apertures 24 by an automated pin inserting machine (not shown). Although much slower and inefficient, the wire elements 12 may be installed by hand into pin receiving apertures.

Once all of the U-shaped wire elements 12 have been installed into die member 10, base element 14, with channels 16 therein, may be moved into communication with die member 10 and wire elements 12 therein. The channels 16, within base element 14, preferably run lengthwise along the entire width of base element 14, are parallel and are equidistant from one another. Channels 16 must match with rows of wire elements 12 installed in die member 10. As can be understood, various other patterns of channels 16 may be formed in base element 14 to correspond with a matching pattern of installed wire elements 12 in die member 10 to achieve any desired multiple pin pattern.

Once base element 14 is aligned with die member 10 as discussed above, a sufficient downward pressure is applied to the base element to swage and expand the central portions 12b of wire elements 12 into the matching channels 16 above for permanent attachment of wire elements 12 to base element 14. As previously discussed, it is preferred that the diameter of central portion 12b be slightly larger than the width of channel 16 to ensure a press-fit after downward pressure is applied to the base element and the base element 14 and die member 10 are in contact with one another.

Figure 7:
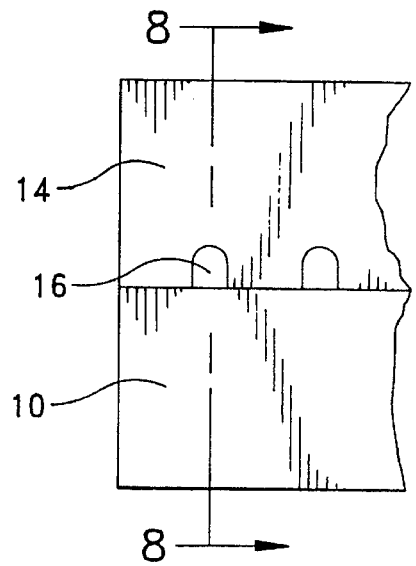
FIG. 7 is a side elevational view of a base element in contact with the die member during a step of the method of manufacture of a multiple pin heatsink device in accordance with the present invention.
Figure 8:
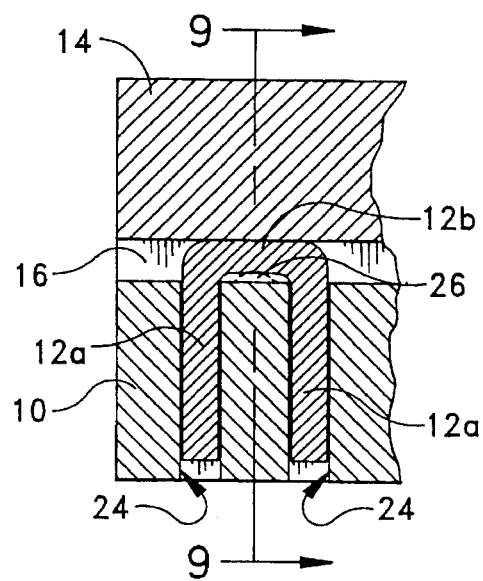
FIG. 8 is a cross-sectional view through the line 8—8 of FIG. 7.
Figure 9:
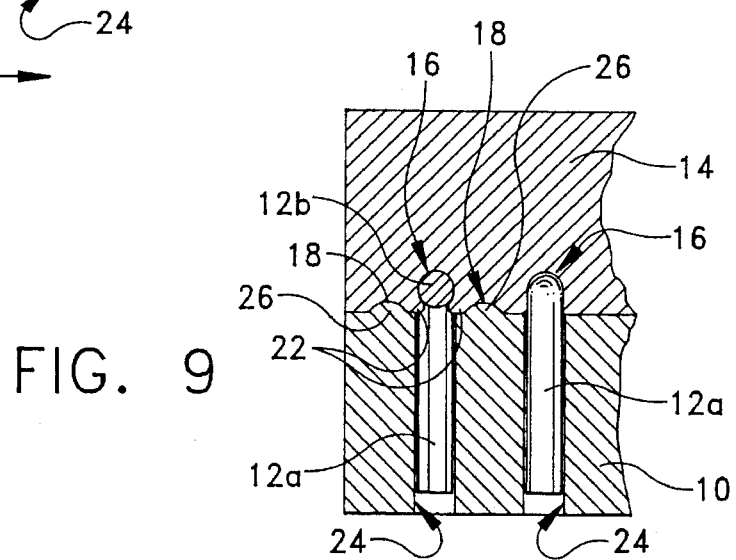
FIG. 9 is a cross-sectional view through the line 9—9 of FIG. 8.

The point at which base element 14 has been driven, through sufficient pressure, down to die member 10, is shown in FIG. 7. In a cross-sectional view through line 8—8 of FIG. 7, FIG. 8 shows the communication of the central portion 12b of wire element 12 being swaged into a press-fit into channel 16 in base element 14. FIG. 8 shows pins 12a still remaining within pin receiving apertures 24 to ensure proper alignment through the swaging process. In addition to receiving a press-fit, wire elements 12 are also locked into their respective channel 16 through a lateral locking of a portion of base element 14 due to the impact of protrusions 26 on either side of channel 16 and central portion 12b. As can be seen in FIG. 9, protrusions 26, on either side of channel 16, impact base element 14 to form indents 18 which can also be seen in FIG. 1 in the finished multiple pin heatsink assembly 30. Still referring to FIG. 9, the impact of protrusions 26 causes a displacement of material of base element 14 in a direction inwardly toward channel 16. Since the height of protrusions 26 is lower than the height of central portion 12b, the indents 18 are not formed until central portion 12b is seated in press-fit fashion in channel 16. The protrusions 26 effectively lock the wire element 12 in its channel 16.

Once the mechanical swaging and installation of wire elements 12 into base element 14 is complete, the combined structure is easily pulled from die member 10 to reveal the completed multiple pin heatsink device 30, as shown in FIG. 1.

Figure 10:
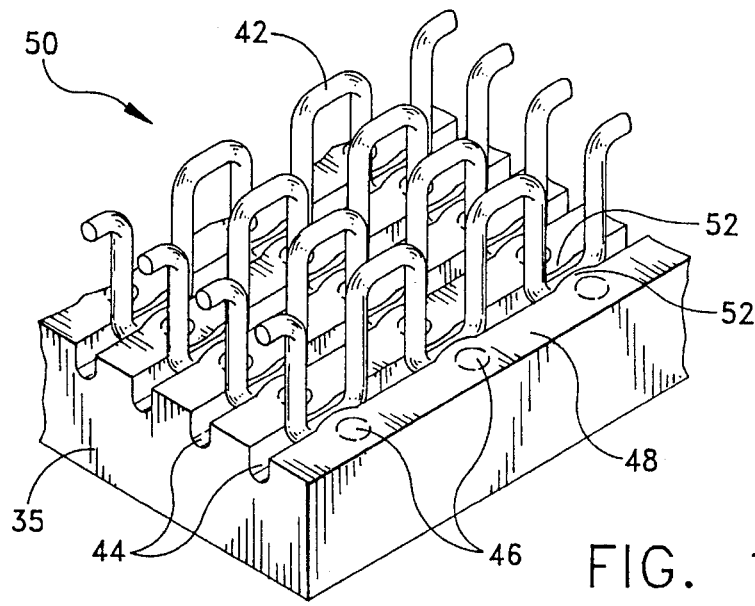
FIG. 10 is a perspective view of an alternative embodiment of a multiple pin heatsink device of the present invention.

FIG. 10 shows a perspective view of an alternative embodiment 50 of the multiple pin heatsink device of the present invention. The base element 35 is shown to include a number of channels 44 for receiving serpentine wire element 42. Base element 35 of the alternative embodiment 50 is substantially identical to base element 14 of the preferred embodiment 30 of the present invention. Base element 35, after installation according to the alternative method of the present invention, indents 46 are formed to create retaining lips into channels 44 to secure the horizontal portions of wire element 42 in addition to a press-fit.

Figure 11:
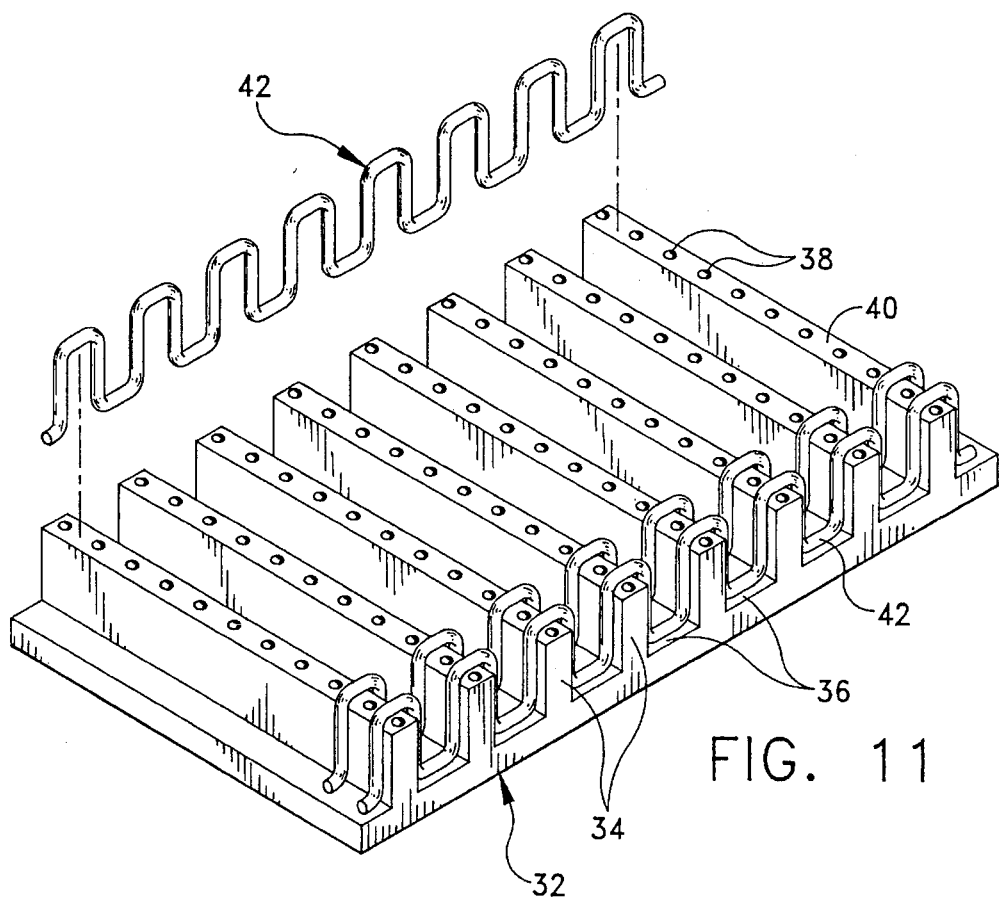
FIG. 11 is a perspective view of a die member and wire elements employed in the manufacture of a multiple pin heatsink device manufactured in accordance with an alternative embodiment of the present invention and for manufacturing the multiple pin heatsink device of FIG. 10.

FIG. 11 shows the method of manufacture in accordance with an alternative embodiment of the present invention to from the heatsink device 50 of FIG. 10. A length of wire element 42 is placed over the upper surfaces of upstanding walls 34 of die 32. A complementary die (not shown) is brought into communication with die member 32 to crimp wire element 42 onto upper surfaces 40 of upstanding walls 34 and down into grooves 36 to form a generally serpentine pattern. Once the wire elements 42 are in place and properly formed from the crimping process, the base element 35 is brought into communication with the portions of wire element 42 resting on the upper surfaces 40 of upstanding walls 34 in similar fashion to the preferred embodiment where base element 14 is brought into communication with central portions 12b of wire elements 12. The upper exposed portions of wire elements 42 are then swaged into channels 44 of base element 35 by downward pressure of base element 35 onto die member 32. Protrusions 38 are provided on upper surfaces 40 of upstanding walls 34 to create indents 46 and resultant retaining lips 52 as described above. Due to the ease of manufacture of the alternative embodiment of FIGS. 10 and 11, this method and configuration may be desirable for certain applications.

Since the connection of wire elements 12, in the preferred embodiment, and wire elements 42 in the alternative embodiment, are connected to their respective base elements 14 and 35 through a solely mechanical metal-to-metal connection, as opposed to metallurgical brazing, welding or soldering, superior heat transfer characteristics result. Further, the joint between the wire element and base plate has a very low thermal resistance. In addition, this solely mechanical method of manufacture has the additional advantage of being able to bond together dissimilar metals to take advantage of their particular properties, conductivity, machinability, as well as weight. For example, it may be desirable to manufacture the base element out of aluminum while providing wire elements manufactured of copper. With the process of the present invention, such a joint is possible through a mechanical press-fit and swaging connection. However, in the prior art, the metallurgical solder joint could not be formed with such dissimilar metals and such a composite heatsink could not be manufactured through casting. The use of the method of the present invention to create a multiple pin heatsink device of the present invention provides flexibility and high thermal transfer not found in prior heatsinks.

It would be appreciated by those skilled in the art that various changes and modifications can be made to the illustrated embodiments without departing from the spirit of the present invention. All such modifications and changes are intended to be covered by the appended claims.

What is claimed is:

1. A method of manufacturing a multiple pin heatsink, comprising the steps of:

providing a die member with a plurality of pairs of pin receiving holes in its upper surface;

providing a base element with a plurality of channels in its upper surface which align and correspond with said pin receiving holes;

providing a plurality of U-shaped wire elements each with two substantially parallel pins and a central portion;

introducing said two pins of each U-shaped wire element into respective pairs of pin receiving holes with said central portion remaining above the upper surface of the die member;

placing said base element over said die member with U-shaped wire elements therein;

applying sufficient downward pressure to said base element to swage and expand the central portions of said wire elements into the matching channel in said base member for permanent attachment of said wire elements to said base element; and removing said base element and said attached wire elements from said die member.

2. The method of claim 1, further comprising the step of:

providing a plurality of protrusions on the upper surface of said die member proximal to the central portions of said U-shaped wire elements;

driving said plurality of protrusions into said base element proximal to said central portions in said channels; and urging portions of said base element, which are proximal to said channels, inwardly into the respective channel and partially over said central portions of said wire elements respectively residing therein to secure said wire elements to said base element.

3. The method of claim 1, further comprising the steps of:

providing a base element manufactured of aluminum; and providing U-shaped wire elements manufactured of copper.

4. The method of claim 1, further comprising the steps of:

providing a base element with a plurality of channels in its upper surface each having a width of 0.061 inches; and providing a plurality of U-shaped wire elements each having a diameter of 0.063 inches.

5. A method of manufacturing a multiple pin heatsink, comprising the steps of:

providing a primary die member with a plurality of upstanding walls each with an upper surface;

providing a secondary die member with depending walls substantially complementary to said primary die member;

placing a plurality of wire elements over the upper surfaces of said upstanding walls;

mating said secondary die member with said primary die member to form said wire elements into the contour of said primary die member;

providing a base element with a plurality of channels in its upper surface which align and correspond with portions of said wire elements positioned on the upper surfaces of said upstanding walls;

placing said base element over said die member with wire elements therein;

applying sufficient downward pressure to said base element to swage and expand the portions of said wire elements positioned on the upper surfaces of said upstanding walls into the matching channel in said base member for permanent attachment of said wire elements to said base element; and removing said base element and said attached wire elements from said die member.

6. The method of claim 5, further comprising the step of:

providing a plurality of protrusions on the upper surface of the upstanding walls proximal to the portions of said wire elements disposed on the upper surface of said upstanding walls;

driving said plurality of protrusions into said base element proximal to said portions of said wire elements disposed on the upper surface of said upstanding walls residing in said channels; and urging portions of said base element, which are proximal to said channels, inwardly into the respective channel and partially over said portions of said wire elements disposed on the upper surface of said upstanding walls respectively residing therein to secure said wire elements to said base element.

7. The method of claim 5, further comprising the steps of:

providing a base element manufactured of aluminum; and providing U-shaped wire elements manufactured of copper.

8. The method of claim 5, further comprising the steps of:

providing a base element with a plurality of channels in its upper surface each having a width of 0.061 inches; and providing a plurality of U-shaped wire elements each having a diameter of 0.063 inches.

* * * * *